United States Patent

Burns et al.

[11] Patent Number: 5,816,238
[45] Date of Patent: Oct. 6, 1998

[54] DURABLE FLUORESCENT SOLAR COLLECTORS

[75] Inventors: David M. Burns, Woodbury; Lee A. Pavelka, Cottage Grove, both of Minn.

[73] Assignee: Minnesota Mining and Manufacturing Company, St. Paul, Minn.

[21] Appl. No.: 752,738

[22] Filed: Nov. 13, 1996

Related U.S. Application Data

[63] Continuation of Ser. No. 519,982, Aug. 28, 1995, abandoned, which is a continuation-in-part of Ser. No. 345,608, Nov. 28, 1994, abandoned.

[51] Int. Cl.$^6$ .............................. F24J 2/00; B32B 27/36
[52] U.S. Cl. .................... 126/569; 126/684; 126/705; 428/412; 428/911; 428/913; 136/243; 136/247; 136/252; 252/301.16; 252/301.21; 252/301.35; 252/301.36
[58] Field of Search .................... 428/412, 911, 428/913; 126/569, 684, 705; 136/243, 247, 252; 252/301.16, 301.21, 301.35, 301.36

[56] References Cited

U.S. PATENT DOCUMENTS

| | | | |
|---|---|---|---|
| Re. 34,141 | 12/1992 | Okuda | 524/86 |
| 3,116,256 | 12/1963 | D'Alello | 252/301.2 |
| 3,830,682 | 8/1974 | Rowland | 161/2 |
| 3,970,632 | 7/1976 | Yoshiura et al. | 524/87 |

(List continued on next page.)

FOREIGN PATENT DOCUMENTS

| | | |
|---|---|---|
| 0 489 561 | 6/1992 | European Pat. Off. . |
| 0 612 796 | 8/1994 | European Pat. Off. . |
| 0 637 493 | 2/1995 | European Pat. Off. . |
| 0 735 596 A1 | 10/1996 | European Pat. Off. . |
| 43 13 519 | 10/1994 | Germany . |
| 57-23921 | 2/1982 | Japan . |
| 57-119941 | 7/1982 | Japan . |
| 58-98357 | 6/1983 | Japan . |
| 2 16042 | 2/1990 | Japan . |
| WO 95/17015 | 6/1995 | WIPO . |
| WO 96/17012 | 6/1996 | WIPO . |

OTHER PUBLICATIONS

"The Photochemistry of Bisphenol–A Polycarbonate Reconsidered", by Rivaton et al., *Polymer Photochemistry*, vol. 3, 463–481, 1983.

"The formulation of Fluorescent Coatings", by Martindill et al., *Jocca*, 485–486, 497, 1989.

"Characteristic Features of the Matrix Effect on the Stokes Shift of Fluorescent Dye Molecules in Pure and Plasticized Polymers", by Eisenbach, *Journal of Applied Polymer Science*, vol. 28, 1819–1827, 1983.

"New Daylight Fluorescent Pigments", by Carlini et al., *Dyes and Pigments*, vol. 3, 59–69, 1982.

"Structure and Properties of Aromatic Polycarbonates", *Chemistry and Physics of Polycarbonates*, by Schnell, p. 183, 1964.

"Study on Luminescent Solar Concentrators of Fluorescent Dye", by Zhong Jiawei, Jim Xiehui and Huang Songyu, *Journal of East China Institute of Chemical Technology*, vol. 16, No. 2, pp. 182–186 1990. Original and English translation.

Hayashibara, M. et al., "Concentrators Using Fluorescent Substances," *International Journal of Solar Energy*, V. 8, No. 2, Mar. 1, 1990, pp. 71–79.

*Primary Examiner*—Randy Gulakowski
*Attorney, Agent, or Firm*—Robert H. Jordan

[57] ABSTRACT

A solar collector exhibiting durable fluorescent properties comprising a polymeric matrix, dye, and hindered amine light stabilizer, wherein the polymeric matrix is comprised of polycarbonate and the dye is comprised of a dye selected from the group consisting essentially of thioxanthone, perylene imide and/or thioindigoid compounds. The solar collector exhibits durable fluorescence which resists degradation by ultraviolet or visible radiation. The invention is optionally combined with reflective elements so that the sunlight collected may be directed to a solar cell.

10 Claims, 1 Drawing Sheet

U.S. PATENT DOCUMENTS

| | | | |
|---|---|---|---|
| 4,004,572 | 1/1977 | Nathan et al. | 126/270 |
| 4,082,082 | 4/1978 | Harvey | 126/271 |
| 4,110,123 | 8/1978 | Goetzberger et al. | 136/89 |
| 4,238,247 | 12/1980 | Oster, Jr. | 136/246 |
| 4,242,414 | 12/1980 | McKenzie | 428/412 |
| 4,488,047 | 12/1984 | Thomas | 250/486.1 |
| 4,544,725 | 10/1985 | Priola et al. | 525/467 |
| 4,691,015 | 9/1987 | Behrens et al. | 544/198 |
| 4,743,642 | 5/1988 | Yanacek et al. | 524/358 |
| 4,778,837 | 10/1988 | Waterman et al. | 524/89 |
| 4,839,405 | 6/1989 | Speelman et al. | 524/102 |
| 4,857,595 | 8/1989 | Kazmierzak et al. | 525/142 |
| 4,863,981 | 9/1989 | Gugumus | 524/97 |
| 4,896,943 | 1/1990 | Tolliver et al. | 350/105 |
| 4,904,574 | 2/1990 | Suzuki | 430/372 |
| 4,938,563 | 7/1990 | Nelson et al. | 350/103 |
| 4,981,773 | 1/1991 | Suzuki | 430/372 |
| 5,004,770 | 4/1991 | Cortolano et al. | 524/102 |
| 5,057,562 | 10/1991 | Reinert | 524/87 |
| 5,068,356 | 11/1991 | Wicher | 548/546 |
| 5,069,964 | 12/1991 | Tolliver et al. | 428/325 |
| 5,073,404 | 12/1991 | Huang | 427/39 |
| 5,096,977 | 3/1992 | MacLeay et al. | 525/343 |
| 5,102,927 | 4/1992 | Rody et al. | 524/100 |
| 5,112,891 | 5/1992 | Haruna et al. | 524/101 |
| 5,124,456 | 6/1992 | Carette et al. | 546/193 |
| 5,132,387 | 7/1992 | Baron et al. | 528/49 |
| 5,140,081 | 8/1992 | Seltzer et al. | 526/204 |
| 5,145,893 | 9/1992 | Galbo et al. | 524/99 |
| 5,162,405 | 11/1992 | MacLeay et al. | 524/291 |
| 5,171,770 | 12/1992 | Nakagawa | 524/91 |
| 5,177,246 | 1/1993 | Pitteloud | 560/67 |
| 5,213,711 | 5/1993 | Fast et al. | 252/301.35 |
| 5,234,888 | 8/1993 | Defiew et al. | 428/413 |
| 5,302,497 | 4/1994 | Berner et al. | 430/512 |
| 5,306,456 | 4/1994 | Suhadolnik et al. | 264/171 |
| 5,334,699 | 8/1994 | Hsieh | 525/437 |
| 5,336,558 | 8/1994 | Debe | 428/323 |
| 5,348,580 | 9/1994 | Chassot | 106/410 |

DURABLE FLUORESCENT SOLAR COLLECTORS

FIELD OF THE INVENTION

This application is a continuation-in-part of U.S. Ser. No. 08/345,608, filed Nov. 28, 1994. The invention relates to articles having increased fluorescence durability. In particular the invention relates to fluorescent solar collectors or concentrators which exhibit increased fluorescence durability.

BACKGROUND

It is commonly known that solar radiation causes colorants to degrade. This is a particularly acute problem for articles exposed to solar radiation for extended periods of time such as solar collectors. Color degradation occurs in articles colored with conventional colorants as well as articles colored with fluorescent colorants. However, this is a particularly acute problem for fluorescent articles. Fluorescent colorants degrade, often turning colorless more quickly than conventional colorants. The effective life of fluorescent materials exposed to daily solar radiation is short and is typically measured in terms of days or months.

Fluorescent colorants are often used in flat plate solar collectors because fluorescent colorants more effectively absorb lower wave length light in the ultraviolet and visible wavelength ranges and emit that energy at higher wavelengths. The higher wavelength light emitted by the fluorescent colored solar collector is more easily converted into electrical energy than the light at lower wavelengths by solar cells. Commonly used silcon solar cells have an optimum efficiency at wavelengths between 500–900 nanometers and are very inefficient below 400 nanometers.

At ground level, solar radiation comprises electromagnetic radiation having wavelengths longer than about 290 nanometers, with the range from about 400 to about 700 nanometers typically considered the visible light range. Radiation having shorter wavelengths than visible light is believed to be damaging to both conventional and fluorescent colorants. Attempts to maintain color of a fluorescent article have included adding ultraviolet screens which selectively filter radiation below the 340 nm to 380 nm range. Japan Kokai No. 2-16042, Application No. 63-165914 (Koshiji, et al.) discloses fluorescent articles comprising a screen layer and a layer containing a fluorescent coloring agent wherein the screen layer only permits a defined range of light transmission. U.S. Pat. No. 5,387,458 also discloses a retroreflective article comprising an ultraviolet screening layer and a color layer contained in a defined polymeric matrix. The article exhibits durable daylight fluorescence and resistance to degradation from exposure to sunlight.

Polycarbonate is known to readily degrade when exposed to solar energy. Attempts to stabilize polycarbonate include adding bizbenzophenone UV absorbers to the polycarbonate as disclosed in U.S. Pat. No. 5,306,456 ("'456 Patent") which is hereby incorporated by reference. The '456 Patent cautions not to add stearically hindered amines to polycarbonate resin or to a polycarbonate copolymer.

U.S. Pat. No. 4,110,123 which is hereby incorporated by reference teaches fluorescent centers (light concentrators) which consist of thin layers of transparent solid or liquid materials with embedded fluorescent centers and which in conjunction with solar cells serve to convert solar energy into electrical energy.

Solar collectors which exhibit enhanced fluorescence durability are needed. In particular, fluorescent solar collectors which retain their fluorescent properties without requiring the use of protectant overlays are needed.

SUMMARY OF THE INVENTION

The present invention provides, in brief summary, solar collectors which exhibit enhanced retention of fluorescent properties without the use of protectant overlays. That is, the solar collectors of the invention retain their ability to fluoresce for a longer period than is normally expected when exposed to direct sunlight. The invention further includes a method to manufacture such durable fluorescent solar collectors.

Solar collectors of the invention comprise (1) polymeric matrix, (2) dye, and (3) hindered amine light stabilizer, wherein the polymeric matrix is comprised of polycarbonate and the dye contains at least one of the compounds selected from the group of thioxanthone, perylene imide, and thioindigoid dyes. The hindered amine light stabilizer is comprised of compounds from the 2,2,6,6-tetraalkyl piperidine class of compounds in a preferred embodiment.

In one embodiment, solar collectors of the present invention also include mirrors or retroreflective elements. The resulting articles exhibit concentration of light and durable fluorescent properties. Such materials exhibit extended ability to collect and/or concentrate light.

BRIEF DESCRIPTION OF THE DRAWINGS

The invention is further explained with reference to the drawings, wherein.

Figure 1:
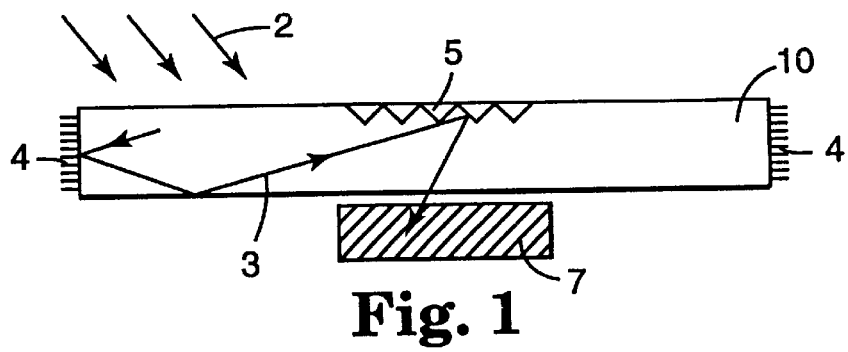
FIG. 1 is a cross-sectional view of an apparatus for light concentration for use in solar cells.

These figures, which are idealized, are not to scale and are intended as merely illustrative and non-limiting.

DEFINITIONS

As referred to herein, the term "colorant" shall mean pigment or dyes or other substances used to impart hue and chroma and value to an article.

As referred to herein, the term "conventional colorant" shall mean colorants which do not exhibit fluorescent properties to the unaided eye.

As referred to herein, the term "dye" shall mean substances which impart color to a substrate by selective absorption of light. Dyes are soluble and/or go through an application process which, at least temporarily, destroys any crystal structure of the color substances. Dyes are retained in the substrate by absorption, solution, and mechanical retention, or by ionic or covalent chemical bonds.

As referred to herein, the term "durable" shall refer to an enhanced retention of color or fluorescence upon exposure to weathering.

As referred to herein, the term "hindered amine light stabilizer" refers to sterically hindered amines of the class of compounds typically represented by 2,2,6,6 tetraalkyl piperidines.

As referred to herein, the term "solar collector" refers to an article useful for absorbing solar energy.

As referred to herein, the term "solar concentrator" shall be used interchangeably with the term "solar collector" but also shall further refer to articles useful for concentrating energy.

As referred to herein, the term "weathering" shall mean exposing an article to either natural or artificial environments which include heat, light, moisture, and ultraviolet radiation.

DETAILED DESCRIPTION OF ILLUSTRATIVE EMBODIMENTS OF THE INVENTION

The present invention combines a polymeric matrix containing dye and hindered amine light stabilizer to create a solar collector which exhibits more durable fluorescence. The polymeric matrix of the invention is first discussed followed by a discussion of suitable dyes and of suitable hindered amine light stabilizers.

Polymeric Matrix

Polycarbonate is the preferred polymeric matrix of the invention because it is substantially transparent and is easily colored with fluorescent and conventional dyes. Additionally, polycarbonate exhibits good optical properties such as good light transmittance which is important for the present invention. Even though polycarbonate exhibits these desirable characteristics, it is surprising that polycarbonate is the polymeric matrix of choice for the present invention. As is commonly known in the art, polycarbonate is photosensitive and degrades when exposed to ultraviolet radiation.

Dye

In a preferred embodiment the fluorescent dyes of the invention are dyes from the thioxanthone, perylene imide and thioindigoid classes of compounds. The invention anticipates that a single fluorescent colorant or dye may be used to color an article of the invention or that a combination of one or more fluorescent colorants and one or more conventional colorants may be used.

Typically, between about 0.01 and about 2.00 weight percent, and preferably between about 0.05 and about 0.70 weight percent and most preferably between about 0.1 and about 0.5 weight percent of fluorescent dye is contained in the article of the present invention. It will be understood that articles with dye loadings outside this range can be used in accordance with the invention. As known by those in the art, articles having heavier dye loadings will exhibit brighter fluorescence than will articles with lighter dye loadings of the same dye. However, articles having very high fluorescent dye loadings may exhibit a self-quenching phenomenon which occurs when molecules of the fluorescent dye absorbs the energy emitted by neighboring fluorescent dye molecules. This self-quenching causes an undesirable decrease in fluorescent brightness.

In some embodiments, the colorant in the articles of the present invention will consist essentially of one or more dyes selected from the perylene imide, thioindigoid and thioxanthone classes of compounds. In other instances, the article may also contain other coloring agents such as pigments or other dyes in addition to those described to adjust the color and appearance of the article. For example, polycarbonate typically has a yellow cast. Minor amounts, e.g., about 0.01 weight percent or less, of pigments sometimes referred to as "bluing agents" may be incorporated to neutralize the yellow appearance. Other non-fluorescent or conventional dyes or pigments may also be added to the present invention, however, care should be taken in selecting such dyes and dye loadings so that the dyes do not significantly interfere with the performance of the fluorescent dyes.

Hindered Amine Light Stabilizers

Hindered amine light stabilizers (HALS) are included in the solar collector of the present invention. This is a somewhat surprising combination because, as one skilled in the art will recognize, it is not recommended to combine amines with polycarbonate. It has traditionally been known that amines attacked the carbonyl group of the polycarbonate, thereby degrading the polycarbonate (for example see Schnell, *Chemistry and Physics of Polycarbonates*, page 183, 1964).

Without intending to be bound by theory, it is believed that the combination of the sterically hindered amine, the polycarbonate matrix and the dye in the present invention prevents an as yet undefined degradation and/or reaction between the dye and the polycarbonate which could otherwise occur. Insofar as we know, the advantages of the present invention are attained through the combination of dye, polymer matrix material, and hindered amine light stabilizer described herein. The dyes in the present invention are thought to act as singlet oxygen sensitizers. Energy transfer, which generally occurs from the triplet state of the dye, is quenched by ground state molecular oxygen to produce active singlet oxygen. The singlet oxygen is then free to react with the dye, causing dye degradation. Alternatively, the singlet oxygen may react with the polymer, leading to degradation of the polycarbonate. However, the hindered amine light stabilizer present in the invention is capable of directly quenching the singlet oxygen formed, preventing initiation of the degradation reactions. The hindered amine light stabilizers can also prevent secondary reactions initiated by polymer oxidation from proceeding. These reactions include a number of radical or peroxide-based chain reactions that are thought to occur in the photo-oxidation of polycarbonate which can result in polymer and dye degradation. Preventing these reactions increases the durability of the polycarbonate and the dye in the dyed system.

Any hindered amine light stabilizer is suitable for the present invention such as 2,2,6,6 tetraalkyl piperidine compounds but preferably 2,2,6,6 tetramethyl piperidine compounds are employed as the hindered amine light stabilizers due to the ready availability of the compounds. The hindered amine light stabilizers are included in articles of the present invention from about 0.05 to about 1.00 weight percent and preferably from about 0.10 to about 0.75 weight percent and most preferably from about 0.1 to about 0.5 weight percent.

Solar Collectors

Solar collectors are typically used in conjunction with solar cells. The solar or silicon cells convert light energy into electrical energy. Conventional silicon cells suffer from inefficiency problems. Therefore, solar collectors which are generally comprised of a thin polymer film having mirrored edges or other means concentrate or direct the incident sunlight into the solar silicon cells. Luminescent solar collectors may use fluorescent dyes to absorb lower wavelengths in the ultraviolet and visible wavelength ranges and emit that energy at higher wavelengths which the silicon solar cell is more efficient at converting to energy. Using articles of the present invention in solar collectors allow more efficient use of solar energy and also provide more photostable solar collectors due to the fluorescent durability of articles of the present invention.

A simple embodiment is shown in FIG. 1. Sunlight 2 is absorbed in light concentrator 10 and is converted with approximately 100 percent quantum yield into fluorescent light 3 and is deflected at the reflectively coated notches 5 so that it leaves the plate and impinges a solar cell 7, where it is converted into electrical energy.

Figure 2:
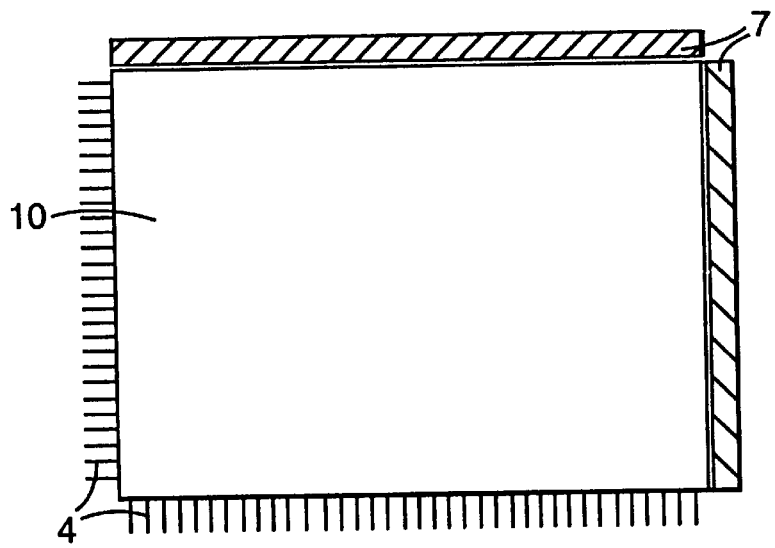
FIG. 2 is an alternate embodiment of the invention showing a light concentrator.

Another effective embodiment is shown in FIG. 2. The plate-shaped light concentrator 10 is reflectively coated at two faces 4 and unreflectorized at the remaining two faces. At the unreflectorized faces, the fluorescent light is emitted and impinges the solar cells 7.

The use of such a concentrator initially brings about a substantial price reduction of the entire energy conversion system, since the area of the solar cell may be smaller by a factor 10 to 2000 than the energy collecting area. The plastic plate is materially cheaper than the solar cell. Therefore, optimum solar cells with a high efficiency may be used.

U.S. Pat. No. 4,110,123 which is herein incorporated by reference discloses numerous embodiments of solar concentrators or solar collectors which when used in conjunction with solar cells convert light energy into electrical energy.

Ultraviolet Protectant Overlays

Figure 3:
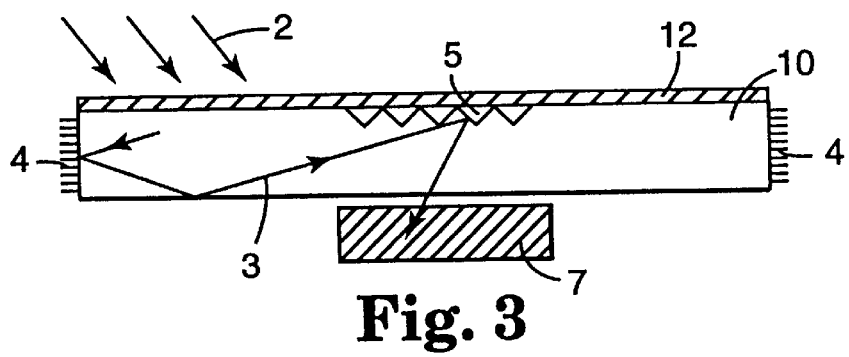
FIG. 3 is an embodiment similar to that in FIG. 2 further including a protective overlay.

Although not necessary, articles of the present invention may optionally include an overlay which may or may not include ultraviolet absorbing agents. Some additional improvement in resisting degradation is observed when the article of the present invention is covered by an overlay including ultraviolet absorbing agents and is exposed to sunlight. The overlay is preferably substantially transparent to visible light and includes a means to screen substantial portions of incident ultraviolet radiation. FIG. 3 illustrates a retroreflective embodiment of the present invention similar to that shown in FIG. 1 and further including an overlay 12. The solar collector which is comprised of polymeric matrix/dye/hindered amine light stabilizer is shown as a plate 10. The overlay 12 is preferably coextensive with the composite plate 10 so as to provide the most protection to the collector 10.

EXAMPLES

The invention is further explained by the following illustrative examples which are intended as nonlimiting. Unless otherwise indicated, all amounts are expressed in parts by weight.

The following abbreviations are used in the examples:

| Abbreviation | Meaning |
| --- | --- |
| PC | Polycarbonate; |
| PMMA | Polymethylmethacrylate; |
| SO63 | HOSTASOL RED GG ™ - Solvent Orange 63 thioxanthone dye from Hoechst Celanese; |
| RED 41 | HOSTASOL RED 5B ™ - Vat Red 41 thioindigoid dye from Hoechst Celanese; |
| PI 240 | LUMOGEN F240 ™ Orange - perylene imide dye from BASF; |
| SY 160:1 | MACROLEX 10GN ™ Solvent Yellow 160:1 benzoxazole coumarin dye from Mobay Corp. |
| SG 5 | FLUOROL GREEN GOLD 084 ™ Solvent Green 5 perylene dye from BASF |
| HALS1 | Dimethyl succinate polymer with 4-hydroxy-2,2,6,6-tetramethyl-1-piperidine ethanol available as TINUVIN 622 from Ciba-Geigy Corp, Hawthorne, NY. |
| HALS2 | Poly [6[(1,1,3,3-tetramethybutyl) amino]-s-triazine-2,4-diyl] [2,2,6,6-tetramethyl-4-piperidyl) imino] hexamethylene [(2,2,6,6-tetramethyl-4-piperidyl) imino)] available as CHIMASORB 944FL from Ciba-Geigy Corp. |
| HALS3 | bis (2,2,6,6-Tetramethyl-4-pipendinyl) sebacate available as TINUVIN 770 from Ciba-Geigy Corp. |

Unless otherwise indicated, the following test methods were used.

Accelerated Weathering

In order to simulate outdoor exposure to sunlight on an accelerated basis, the samples in Examples 1 through 6 and 8 were exposed in accordance to ASTM G26-Type B, Method A, with a water-cooled xenon arc device with borosilicate inner and outer filters for periods of 102 minutes of exposure at a Black Panel temperature of about 63° C. followed by 18 minutes of exposure while subjecting the sample to deionized water spray. One thousand hours exposure in this cycle is believed equivalent to at least several months exposure to direct outdoor sunlight.

Fluorescence

Fluorescence was determined by the following technique.

A Labscan 6000 Spectrophotometer from Hunter was used at the following settings and conditions:

Illuminant $D_{65}$,

0/45 Geometry, 25 millimeter port,

CIE 2 Degree Standard Observer, with measurements taken every 10 nanometers over a range of 400 to 700 nanometers.

Percent of Initial Peak Total Spectral Radience Factor (%PTSR) was calculated as the ratio, in percent, of peak total spectral radiance factor of the sample after exposure for the indicated time (time t) to the peak total spectral radiance factor of an unexposed sample at the wavelength of the initial peak total spectral radiance. This is better illustrated by the following equation.

$$\% \, PTSR = \frac{\text{Peak Total Spectral Radiance of exposed}}{\text{Peak Total Spectral Radiance of unexposed}} \times 100$$

Peak total spectral radiance factor is a relative measure of the fluorescence content. Fluorescence content is directly correlated to the amount of fluorescent dye, therefore, peak reflectance is a relative measure of the fluorescent dye content remaining. Difference in % PTSR of about 5 or less are generally not considered as significant for measurements made on constructions.

Retained Fluorescence

Fluorescence was measured using a SLM AB2 Luminescence Spectrophotometer (SLM Instruments, Rochester, N.Y.) using a 150 watt continuous Xenon lamp.

Retained Fluorescence was calculated as the ratio, in percent, of fluorescent intensity of the sample after exposure for the indicated length of time to the fluorescent intensity of an unexposed sample, at the wavelength of peak emission of the unexposed sample.

Molecular Weight

Molecular weight was measured by gel permeation chromatography (GPC) using a set of MICROSTYRAGEL brand columns available from Waters Division of Millipore Corp, Milford, Mass. and polystyrene standards for calibration. Samples were dissolved and run in tetrahydrofuran at 30° C. at a flow rate of 1.0 milliliter per minute. A UV detector set at 266 nm was used for detection of polycarbonate.

Exterior Weathering

Exterior weathering was done on samples about 7×12 centimeters in size. The samples were adhered to an aluminum coupon which was mounted on a black painted panel facing upward at 45° from vertical and facing south. The samples were exposed for 12 months in Wittmann, Ariz.

Determining Time to 50% Dye Loss

Films were mounted onto aluminum slide frames, overlaid with an ultraviolet transparent polyolefin film which was a 2 mil (0.005 cm) thick film of an ethylene/acrylic acid copolymer made from Primacor 3440 available from Dow Corporation of Midland, Mich. and exposed in accordance with ASTM G26, Type B, Method A, as described earlier.

The dye concentration in each sample was measured initially and after every 500 hours exposure. The samples were exposed for a total of 2000 hours. The Time-to-50%-Dye-Loss for each sample was graphically interpolated from plots of dye concentration versus total exposure (i.e. [SO63] vs Hours).

Dye concentrations were determined from UV-Visible spectroscopic measurements of the sample films using the Beer-Lambert Law. All measurements were made on a Beckman Model DU-70 UV Visible Spectrophotometer.

Example 1

Example 1 illustrates the improved durability of fluorescent properties and color of fluorescent dye SO63 with a hindered amine light stabilizer and compares the durability of a sample with a sample including an ultraviolet protectant overlay.

Films were prepared for Example 1 as follows. The fluorescent dye and HALS (if present) were blended with polycarbonate resin pellets. The fluorescent dye was added to the polycarbonate resin pellets at 0.2 weight percent loading. The hindered amine light stabilizer, if present, was incorporated into the mixture at 0.26 wt% loading. The resin pellets used were Makrolon FCR-2407 available from Miles Inc. of Pittsburgh, Pa. The dye/resin/HALS mixture was dried overnight to remove moisture. After drying overnight, the mixture was extruded into film of about 4–6 mils (0.1–0.15 mm) thick using a single screw extruder with three heating zones set at 260° C., 260° C. and 304° C. and a film die set at 304° C. The extruder was a ¾ inch single screw extruder for the Haake Rheocord as available from Haake of Karlsruhe, Germany.

The film was then laminated onto 3M Brand Scotchlite™ Diamond Grade Retroreflective Sheeting 3970G construction (as manufactured by 3M Company of St. Paul, Minn.) using a transparent acrylic adhesive. An overlay film consisting of urethane-acrylic film with or without a UV absorber as (indicated in the Table 1) was laminated over the fluorescent/retroreflective construction with acrylic adhesive.

The hindered amine light stabilizer (HALS) used for Example 1 samples was HALS 1 (Tinuvin 622), an oligomeric tertiary amine. Comparable films without HALS were also prepared as described earlier and laminated to form samples having a fluorescent/retroreflective/overlay constructions and all samples were weathered in accelerated test devices as described above. Fluorescence retention were assessed by color measurements on the Hunter Labscan 6000. Fluorescence durability is correlated to %PTSR.

TABLE 1

| Sample[1] | HALS[2] | UV Absorber[3] | % of Initial Peak Spectral Radiance Factor Accelerated exposure in Hours | | | |
|---|---|---|---|---|---|---|
| | | | 500 | 1000 | 1500 | 2000 |
| 1-A | Yes | No | 86% | 80% | 68% | 61% |
| 1-B | No | No | 80% | 60% | 54% | 43% |
| 1-C | Yes | Yes | 90% | 84% | 80% | 63% |
| 1-D | No | Yes | 87% | 73% | 63% | 46% |

[1]All Samples contained dye SO63 at 0.2 wt % loading
[2]HALS 1 at 0.26 wt % loading
[3]UV absorber was Uvinol 400 from BASF at 3 wt % loading.

The results shown in Table 1 illustrate that the HALS offers a substantial improvement in fluorescence durability of SO63 with or without an ultraviolet protectant overlay. The samples containing HALS showed an improvement in fluorescence durability as compared to those samples without HALS. Additionally, an improvement was observed in the HALS-containing samples when a UV absorbing overlay was added to the sample.

Example 2

Example 2 illustrates the improved durability of fluorescent properties of dye RED41 in articles of the present invention.

Samples 2E through 2H of Example 2 were prepared as described in Example 1 except that the polycarbonate resin used was Lexan 123R-112 as available from GE Plastics of Mt. Vernon, Ind. The hindered amine light stabilizer used for the samples in Example 2 was HALS 1. Samples were weathered using accelerated-weathering devices for the time periods noted. The results are recorded in Table 2 below.

TABLE 2

| Sample[1] | HALS[2] | UVA[3] | % of Initial Peak Total Spectral Radiance Factor For exposure in Hours | |
|---|---|---|---|---|
| | | | 500 | 1000 |
| 2-E | No | No | 81% | 53% |
| 2-F | Yes | No | 76% | 63% |
| 2-G | No | Yes | 92% | 62% |
| 2-H | Yes | Yes | 91% | 77% |

[1]Samples 2E–2H include dye Red 41 at 0.2 wt % loading
[2]HALS 1 at 0.26 wt % loading.
[3]Urethane-acrylic overlay with 3% Uvinol 400.

Example 3

Example 3 illustrates different hindered amine stabilizers at different loadings are suitable for increasing the durability of fluorescent dye SO63.

Films were prepared as described in Example 1. The amount and type of HALS and dye added to each film is designated in Table 3 below. The Samples were exposed in an accelerated weathering device as described earlier.

TABLE 3

| Sample* | Film Caliper (mm) | Initial Weight % SO63 | Additive/ Weight % | Time to 50% Dye Loss |
|---|---|---|---|---|
| CONTROL | 0.1 | 0.2 | None | 420 hours |
| 3A | 0.1 | 0.2 | HALS 2/0.25% | 800 hours |
| 3B | 0.1 | 0.2 | HALS 2/0.5% | 740 hours |
| 3C | 0.1 | 0.2 | HALS 1/0.5% | 550 hours |

The results in Table 3 illustrate that different hindered amine light stabilizers, including HALS 2 and HALS 1, are effective at increasing the durability of SO63 fluorescent dye.

Example 4

Example 4 illustrates a range of dye loadings is suitable for the present invention.

Samples were prepared as described in Example 3. Dye SO63 and HALS 1 were used to prepare the samples. In samples containing HALS, 0.50 wt percent HALS 1 was included. The amount of dye added to each sample is listed below. The samples were weathered by exposing them to accelerated weathering.

TABLE 4

| Sample | Film Caliper (mm) | Initial Weight % SO63 | HALS/ Weight % | Time to 50% Dye Loss |
|---|---|---|---|---|
| CONTROL | 0.1 | 0.2 | None | 420 hours |
| 3C | 0.1 | 0.2 | HALS 1/0.5% | 550 hours |
| 4A | 0.1 | 0.4 | HALS 1/0.5% | 570 hours |

The results in Table 4 demonstrate that HALS is effective at different dye loadings.

Example 5

Example 5 illustrates different hindered amine light stabilizers with a range of loadings are suitable for the present invention.

Films were prepared as described in Example 1. The resin used was Makrolon FCR-2407 from Miles Incorporated of Pittsburgh, Pa. Samples were prepared by hot laminating the colored films to a clear layer with retroreflective elements embossed in a second side and hot laminating a PMMA overlay layer to the first side of the colored films. All colored films contained dye SO63 at 0.20 weight percent. HALS 1 was added to the films as designated in Table 5 below. The samples were weathered by exposing them in an accelerated device for 1000 hours. Results are shown in Table 5.

TABLE 5

| | | | | % PTRSF for Accelerated Weathering for 1000 Hours |
|---|---|---|---|---|
| Sample | [SO63] wt % | HALS | [HALS] wt % | % PTSRF |
| 5A | 0.2 | — | 0 | 75% |
| 5B | 0.2 | HALS 1 | 0.1 | 89% |
| 5C | 0.2 | HALS 1 | 0.25 | 89% |
| 5D | 0.2 | HALS 1 | 0.5 | 90% |

The results illustrate HALS 1 is effective at a variety of loadings for increasing the durability of the fluorescent properties of dye SO63.

Comparative Example 6

Comparative Example 6 illustrates polymethyl methacrylate is not a suitable polymeric matrix for manufacturing articles of the present invention because such articles do not exhibit increased durability of fluorescent properties or color.

The films for Comparative Example 6 were prepared as described in Example 1 except the polymeric matrix used was polymethyl methacrylate (PMMA) instead of polycarbonate. The PMMA used was either Perspex CP924 or CP923 from ICI Acrylics (St. Louis, Mo.) or Lucite 47K from Dupont (Wilmington, Del.), all contained roughly 0.3 wt% UV absorber of a benzotriazole type. The HALS used (if any) was HALS 1 added at a loading of 0.25 weight percent. Extrusion temperatures for the PMMA were 249° to 260° C. Samples were prepared by hot laminating either four 3 mil (0.075 mm) colored films or two 6 mil (0.15 mm) colored films together and embossing retroreflective elements on the second side of the laminated construction. The samples were weathered by exposing them to accelerated weathering for the times listed in Table 6.

TABLE 6

| | | | % of Initial Peak Total Spectral Radiance Factor for Exposure in Hours for PMMA[1] | |
|---|---|---|---|---|
| Sample | Dye[2] | HALS[3] | 500 Hrs | 1000 Hrs |
| 6A | SO63 | Yes | 74% | 72% |
| 6A-1 | SO63 | No | 85% | 78% |
| 6B | Red 41 | Yes | 66% | 61% |
| 6B-1 | Red 41 | No | 70% | 63% |
| 6C | PI 240 | Yes | 93% | 92% |
| 6C-1 | PI 240 | No | 89% | 90% |

[1]Polymethyl methacrylate
[2]Dye was added to the samples at a loading of 0.20 weight percent except sample 6C-1 which was at 0.29 weight percent
[3]HALS 1 was added at 0.25 wt percent As discussed above, no increase of fluorescence or color durability is observed (Table 6) when adding a HALS and a fluorescent dye to polymethyl methacrylate.

Example 7

Example 7 illustrates that polycarbonate is more durable if a hindered amine light stabilizer is included along with the polymeric matrix and a fluorescent dye.

The samples for Example 7 were prepared as described in Example 5. The resin used was Makrolon FCR-2407 from Miles Inc. Dye SO63 was added to the samples at a loading of 0.2 weight percent. The hindered amine light stabilizer and the amount added to each sample is listed below in Table 7. The samples were weathered by exterior exposure for 12 months as described above.

TABLE 7

| | | | Polycarbonate Number Average Molecular Weight | | Peak Total Spectral Radiance Factor Retained (% |
|---|---|---|---|---|---|
| Sample | HALS | Weight % HALS | Unexposed | Exposed | of Initial) |
| Control | None | 0 | 17,796 | 12,058 | 55 |
| 7-A | HALS 2 | 0.25 | 17,687 | 15,865 | 87 |

TABLE 7-continued

| Sample | HALS | Weight % HALS | Polycarbonate Number Average Molecular Weight Unexposed | Exposed | Peak Total Spectral Radiance Factor Retained (% of Initial) |
|---|---|---|---|---|---|
| 7-B | HALS 2 | 0.50 | 17,836 | 15,552 | 87 |
| 7-C | HALS 3 | 0.50 | 17,934 | 15,311 | 77 |

The molecular weight results shown in Table 7 illustrate the polycarbonate and fluorescent dye samples containing HALS did not degrade as readily as the control which did not contain HALS. Thus, the present invention helps to increase the durability of polycarbonate.

The results in Table 7 further show that the fluorescent properties in the samples containing the HALS did not change color as readily as the samples which did not contain the HALS.

Example 8

Example 8 illustrates the effect of several different hindered amine light stabilizers on fluorescent color durability on outdoor exposure.

Samples were prepared as in Example 5, except that a second color layer was used in place of the clear layer and it was embossed with retroreflective elements. The resin used was Makrolon FCR-2407 from Miles Inc. All colored films contained dye SO63 at 0.25 wt percent in polycarbonate, the hindered amines added are designated in Table 8 and were added at 0.25 wt percent. The samples were exposed in Arizona for 1 year as described earlier and measurements were taken for Percent of Initial Peak Total Spectral Radiance and color change. The color change results are given in Table 8.

TABLE 8

| | 12 months Arizona Exposure | |
|---|---|---|
| Sample | HALS ADDED | % PTSRF |
| Control | None | 43 |
| 8-A | HALS 1 | 70 |
| 8-B | HALS 2 | 83 |
| 8-C | HALS 3 | 89 |

Example 9

Example 9 illustrates the enhanced fluorescence durability of samples of the present invention as measured by a spectrofluorometer. Samples were prepared as in Example 5 and exposed to accelerated weathering. Readings were taken initially and at 2500 hours. The HALS, the dye and the respective loadings are listed in Table 9 below along with the results.

TABLE 9

| Sample | [HALS] | Dye [SO63] | % Retained Fluorescence | % PTSRF |
|---|---|---|---|---|
| Control 9A[1] | 0 | 0.2 wt % | 31% | 48% |
| 9B[1] | HALS 2/ 0.2 wt % | 0.2 wt % | 78% | 77% |

TABLE 9-continued

| Sample | [HALS] | Dye [SO63] | % Retained Fluorescence | % PTSRF |
|---|---|---|---|---|
| Control 9C[2] | 0.25 wt % 0 | 0.2 wt % | 26% | 42% |
| 9D[2] | HALS 3/ 0.25 wt % | 0.2 wt % | 81% | 81% |

[1]Polycarbonate was comprised of Makrolon 2407
[2]Polycarbonate was comprised of 80% Makrolon 2407 and 20% Lexan 123R Comparative Example 10

Comparative Example 10 illustrates that fluorescent dyes SY 160:1 and SG 5 are not suitable dyes for the present invention. Films were prepared as described in Example 1. Samples 10A, 10B and 10D were prepared by hot laminating two 4 mil (0.1 mm) colored films together. A 2 mil PMMA overlay containing 1.8% Tinuvin 327 (UV absorber available from Ciba-Geigy) was hot laminated to a first side of the colored laminate. Sample 10C was prepared by hot laminating a 3 mil PMMA overlay containing 12 weight percent Tinuvin 327 to a first side of a 12 mil (0.3 mm) film and embossing retroreflective elements in the second side of the film. The polycarbonate resin used in Samples 10A and 10B was Makrolon 2407 and Lexan 123R-112 was used in Samples 10C and 10D.

Samples 10E and 10F are samples which are provided for comparison purposes. Samples 10E and 10F are prepared according to the present invention and demonstrate that perylene imide dyes are suitable for use in the present invention. Sample 10E was formed from polycarbonate resin Lexan 123R-112. A 12 mil polycarbonate film was formed with a 3 mil (0.075 mm) PMMA overlay hot laminated to the first side of the colored film with retroreflective elements embossed into the second side of the colored film. Sample 10-F was formed from polycarbonate resin Lexan 123R-112. The sample was prepared by hot laminating two 4 mil (0.10 mm) colored films together and by laminating a 2 mil (0.05 mm) PMMA overlay to a first surface of the resulting colored film. Retroreflective elements were embossed into the second surface of the colored film. The overlays for samples 10-E and 10-F were made to have the same UV screening ability. The 3 mil (0.75 mm) overlay included 1.2 wt % Tinuvin 327 as available from Ciba Geigy Corp. while the 2 mil (0.05 mm) overlay contained 1.8 wt % Tinuvin 327. The HALS used for all the samples was HALS 1. The samples were weathered by exposing them to accelerated weathering. Results are given in Table 10.

TABLE 10

| Sample | [DYE] wt % | [HALS] wt % | 1000 | 1500 | 2000 |
|---|---|---|---|---|---|
| 10A | SY160:1 0.2 | — | 82% | 79% | 67% |
| 10B | 5Y160:1 0.2 | 0.25 | 84% | 80% | 66% |
| 10C | SG 5 0.2 | — | 50% | 44% | —[1] |
| 10D | SG 5 0.2 | 0.26 | 46% | 42% | —[1] |
| 10E | PI 240 0.2 | — | 83% | —[2] | 76% |

TABLE 10-continued

| Sample | [DYE] wt % | [HALS] wt % | 1000 | 1500 | 2000 |
|--------|-----------|-------------|------|------|------|
| 10F | PI 240 0.2 | 0.26 | 94% | —[2] | 88% |

[1]Data was not measured because of the severe color degradation
[2]Samples were not measured at 1500 hour interval.

One skilled in the art will recognize that details of the previous embodiment may be varied without departing from the spirit and scope of the invention.

We claim:

1. A solar collector exhibiting durable fluorescent properties comprising polymeric matrix, dye and hindered amine light stabilizer, wherein the dye contains at least one of the dyes selected from the group of thioxanthone, perylene imide and thioindigoid compounds and polymeric matrix comprises polycarbonate.

2. The solar collector of claim 1 wherein the solar collector contains about 0.01 to about 2.00 weight percent of said dye.

3. The solar collector of claim 1 wherein said solar collector contains about 0.10 to about 0.75 weight percent of said hindered amine light stabilizer .

4. the solar collector of claim 1 wherein said solar collector contains about 0.05 to 0.70 weight percent of said hindered amine light stabilizer.

5. The solar collector of claim 1 wherein said hindered amine stabilizer is comprised of a 2,2,6,6-tetramethyl piperidine compound.

6. The solar collector of claim 1 further including an overlay.

7. The solar collector of claim 1 further including a means for directing light exiting said collector.

8. The solar collector of claim 7 wherein said means for directing light comprises at least one reflective surface.

9. An apparatus for converting light energy into electrical energy comprised of a solar cell, means for directing light into the solar cell, and a solar collector, said solar collector comprised of polymeric matrix, dye and hindered amine light stabilizer, wherein the dye contains at least one of the dyes selected from the group of thioxanthone, perylene imide and thioindigoid compounds and the polymeric matrix comprises polycarbonate.

10. The apparatus of claim 9 wherein the means for directing light into the solar cell comprises at least one reflective surface.

* * * * *